(12) United States Patent
Kumar

(10) Patent No.: US 9,413,346 B2
(45) Date of Patent: Aug. 9, 2016

(54) CLOCK GLITCH AND LOSS DETECTION CIRCUIT

(71) Applicant: STMicroelectronics International N.V., Amsterdam (NL)

(72) Inventor: Anand Kumar, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 172 days.

(21) Appl. No.: 14/219,142

(22) Filed: Mar. 19, 2014

(65) Prior Publication Data

US 2015/0270836 A1   Sep. 24, 2015

(51) Int. Cl.
*H03K 5/19* (2006.01)
*H03K 5/22* (2006.01)

(52) U.S. Cl.
CPC ........................................ *H03K 5/22* (2013.01)

(58) Field of Classification Search
CPC .............. H03K 5/19; H03K 5/22; H03K 5/26
USPC ............................... 327/13, 18, 20, 31, 35, 37
See application file for complete search history.

(56) References Cited

U.S. PATENT DOCUMENTS

| | | | |
|---|---|---|---|
| 5,642,069 A * | 6/1997 | Waite | 327/292 |
| 5,930,275 A * | 7/1999 | Horst | 714/815 |
| 8,552,764 B2 * | 10/2013 | Rohleder et al. | 327/18 |
| 8,937,496 B1 * | 1/2015 | Ahmad et al. | 327/39 |

* cited by examiner

*Primary Examiner* — William Hernandez
(74) *Attorney, Agent, or Firm* — Gardere Wynne Sewell LLP

(57) ABSTRACT

A conversion circuit measures individual period lengths for periods of a clock signal. Two of the measured period lengths are selected and compared. The comparison operates to compare a first period length against a threshold set as a function of the second period length. The result of the comparison is indicative of the presence of a clock error. If the threshold is set less than the second period length, the comparison functions to detect a clock glitch. If the threshold is set more than the second period, the comparison functions to detect a loss of clock. The result of the comparison may be used to control further handling of the clock signal by, for example, blocking logic state changes in the clock signal for the length of one period in response to the detection of the clock error.

36 Claims, 7 Drawing Sheets

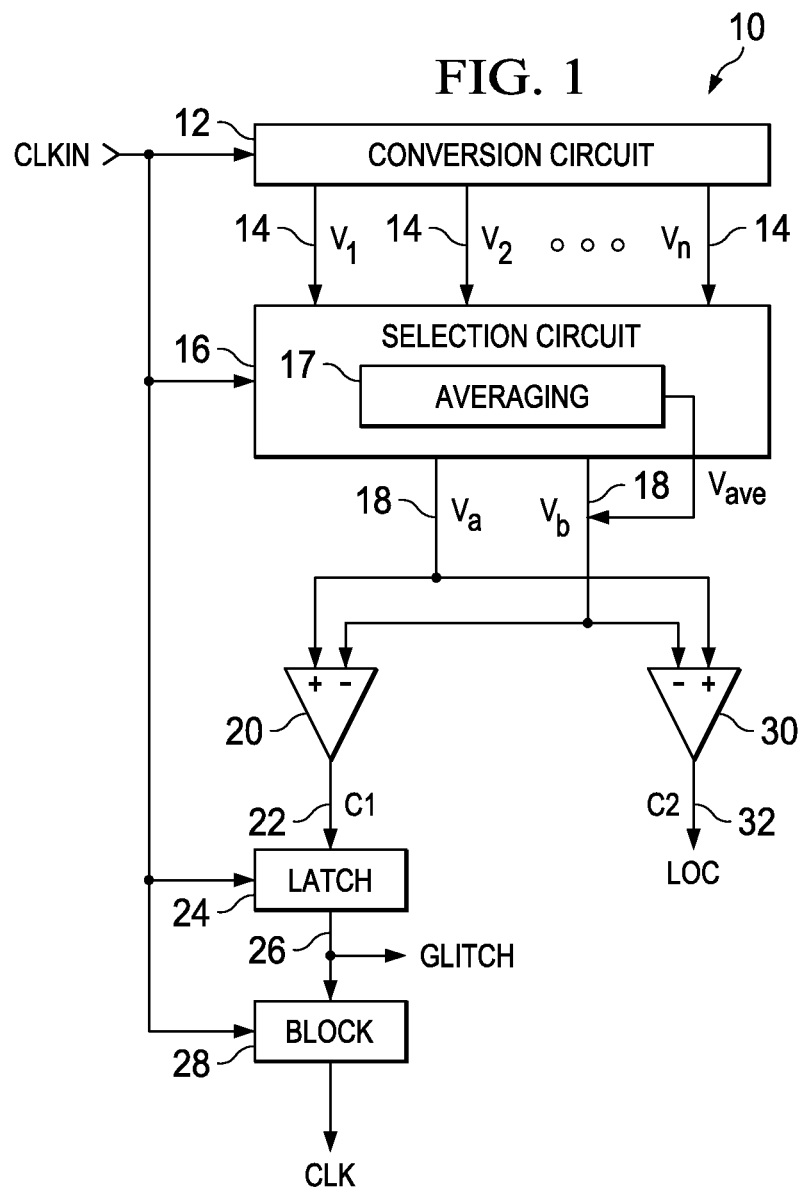

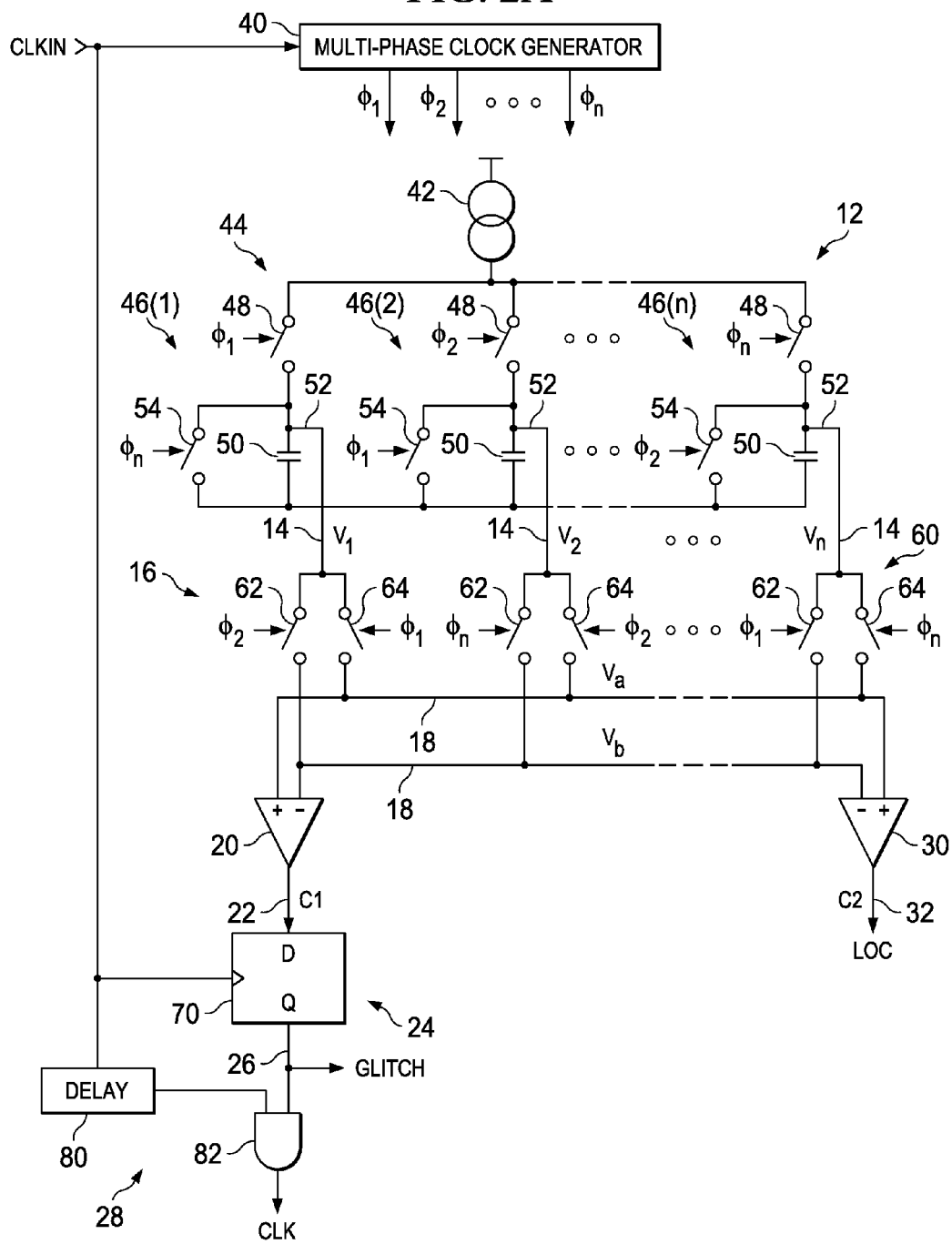

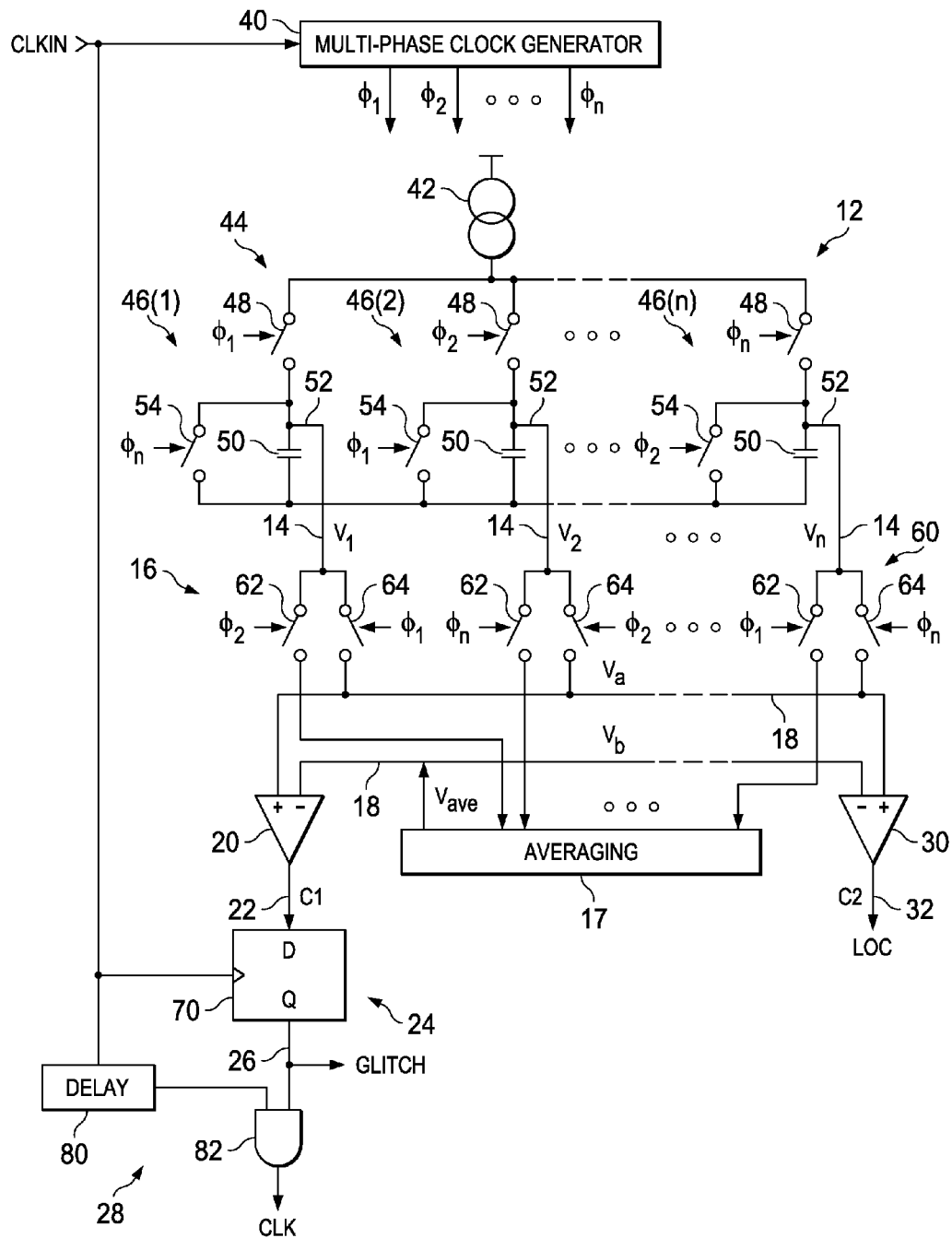

CLOCK GLITCH AND LOSS DETECTION CIRCUIT

FIELD OF THE INVENTION

The present disclosure generally relates to clock monitoring circuits and, more particularly, to monitoring circuits configured to make clock glitch and loss of clock detections.

BACKGROUND

Digital clock signals are commonly used in digital integrated circuits. It is important in order to ensure proper operation of digital integrated circuitry that the clock signal be present and clean. If the clock signal is not present, this is referred to by those skilled in the art as a loss of clock (LOC). A clock signal may not be clean in situations where there is a clock glitch such as with an incorrect timing of a clock edge. Detection of the loss of clock or the occurrence of a clock glitch, generally referred to herein as a clock error, is important in triggering the performance of certain actions by the digital integrated circuitry. For example, in response to the detection of a clock error, the digital circuitry may shut down, enter sleep mode, perform a reset, return to an operating state prior to the clock error detection, generate an error signal output, or perform some other operation.

There is a need in the art for clock error detection circuitry capable of detecting both loss of clock and clock glitch error. The circuitry disclosed herein addresses that need.

In this regard, a clock glitch error generally refers to an error wherein the time period of the clock is shorter than a minimum time period for which the circuits driven by the clock can work accurately, and a loss of clock generally refers to an error wherein the clock stops or experiences a clock period that is longer than a clock timing requirement.

SUMMARY

In an embodiment, a circuit comprises: a conversion circuit configured to measure a signal parameter with respect to each period within a plurality of individual periods of a clock signal; a selection circuit configured to output a first parameter value selected from the measured signal parameters; a first comparator circuit configured to compare the first parameter value to a first threshold; and an output circuit configured to output a first clock error signal in response to said first comparator. The signal parameter may comprise a period length or a pulse length, for example. The threshold may be set as a function of a measured signal parameter.

In an embodiment, a circuit comprises: a conversion circuit configured to measure a period length of each of period within a plurality of individual periods of a clock signal; a selection circuit configured to output a first period length and a second period length selected from the measured period lengths; a first comparator circuit configured to compare the first period length to a first threshold set as a function of the second period length; and an output circuit configured to output a first clock error signal in response to said first comparator.

In an embodiment, a method comprises: measuring a signal parameter with respect to each period within a plurality of individual periods of a clock signal; selecting a first parameter value from the measured signal parameters; first comparing the first parameter value to a first threshold; and outputting a first clock error signal in response to said first comparison. The signal parameter may comprise a period length or a pulse length, for example. The threshold may be set as a function of a measured signal parameter.

In an embodiment, a method comprises: measuring a period length of each period within a plurality of individual periods of a clock signal; selecting a first period length and a second period length from the measured period lengths; comparing the first period length to a first threshold set as a function of the second period length; and outputting a result of said comparison as a first clock error signal.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which:

FIG. 1 is a block diagram of a clock error detection circuit;

FIG. 2A is a circuit diagram for an exemplary embodiment of the clock error detection circuit;

FIG. 2B is a circuit diagram for an exemplary embodiment of the clock error detection circuit;

DETAILED DESCRIPTION OF THE DRAWINGS

Figure 3:
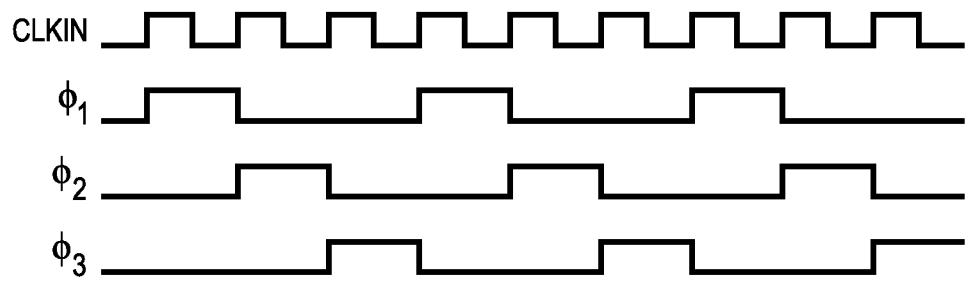
FIG. 3 illustrates multi-phase clock waveforms.

Reference is now made to FIG. 1 which illustrates a block diagram of a clock error detection circuit 10. The circuit 10 includes a clock period conversion circuit 12. The circuit 12 receives the clock signal CLKIN to be monitored. The clock signal CLKIN is, for example, a digital square wave having a clock period P, a frequency F (wherein F=1/P). For each sampled period P of the clock signal CLKIN, the conversion circuit 12 converts the length of the period P to a corresponding period value V. More specifically, the magnitude of the period value V is proportional to the length of the sampled period P for the clock signal CLKIN. The period value V will be generally consistent from period to period if the clock signal CLKIN is operational, stable and clean. However, if the clock signal CLKIN experiences a clock error, such as a loss of clock or a clock glitch, the period value V will vary from one clock period to another clock period. This fact is exploited by the error detection circuit 10 to not only identify that a clock error has occurred, but also identify what type of error (loss of clock or clock glitch) has occurred.

Although specific reference is made to the period, it will be understood that other parameters of the clock signal could be measured and used to identify the presence of clock errors.

The period conversion circuit 12 is accordingly configured to generate and output a plurality of period values Vi (where i=1-n, n being an integer greater than or equal to 2, and more preferably greater than or equal to 3). Each period value Vi would be associated with a corresponding sampled period Pi of the clock signal CLKIN.

In order to minimize the number of outputs 14 that need to be supported, the period conversion circuit 12 can further be configured to operate in a cyclical manner. Thus, for n consecutive periods P of the clock signal CLKIN, the circuit 12 would generate n period values V on the outputs of the circuit 12. For the next (following) n consecutive periods P of the clock signal CLKIN, the circuit 12 would generate n more period values V for output on the same outputs 14 of the circuit 12.

In a preferred implementation of the circuit 12, the period conversion circuit 12 generates analog period values Vi, for example, in the form of a voltage whose magnitude is proportional to the length of the period P of the clock signal CLKIN. However, it will be understood that the period value V may not necessarily be an analog value, but instead the value V may comprise a digital value, for example, in the form of a multi-bit digital count whose magnitude is proportional to the length of the period P of the clock signal CLKIN.

The clock error detection circuit 10 further includes a selection circuit 16 that is configured to select two of the period values from the plurality of received period values Vi output from the period conversion circuit 12, referred to as period values Va and Vb (where a and b comprise two different values of i), for output 18 with each period of the received clock signal CLKIN. In a preferred implementation, the selected period values Va and Vb comprise a first period value Va=Vm corresponding to a current period of the clock signal CLKIN and a second period value Vb=V(m−1) corresponding to the immediately preceding period of the clock signal CLKIN. This preferred implementation is exemplary only, it being understood that any two of the period values V output 14 from the period conversion circuit 12 could be selected, and that the two selected values need not correspond to adjacent periods of the clock signal CLKIN. For example, the selected period values Va and Vb may comprise a first state time value Va=Vm (for the current period) and a second state time value Vb=V(m−2) (for the next preceding period).

In an alternative embodiment, the selection circuit 16 may include an averaging circuit 17. The averaging circuit 17 functions to average two or more of the period values V output 14 from the period conversion circuit 12 and provide that average period value Vave as the selected period value Vb. The averaging circuit 17 may be configured as an analog or digital circuit corresponding to the analog or digital format of the period values V. Circuitry for performing an averaging of two or more input values (analog or digital) is well known to those skilled in the art.

The clock error detection circuit 10 further includes first comparator circuit 20 having a first (for example, non-inverting +) input configured to receive the first period value Va and a second (for example, inverting −) input configured to receive the second period value Vb. The first comparator 20 is configured to have a first threshold (i.e., the comparator trip point) that is set as a function of the received second period value Vb. In a preferred embodiment, the first threshold is set at a value which is less than the received second period value Vb. In an exemplary implementation, the first threshold is equal to 0.9×Vb. The first comparator 20 further has an output 22 configured to generate a first comparator output signal C1 having a logic state set in response to the comparison of the first period value Va to the first threshold. The first comparator output signal C1 has a first logic state (logic 0) if the first period value Va is smaller than the first threshold, and otherwise has a second logic state (logic 1).

The first comparator circuit 20 accordingly operates to compare the lengths of two selected periods of the clock signal CLKIN. The generated first comparator output 22 signal C1 has the first logic state (logic 1) if the length of the current period (provided by Va) is not shorter than 90% of the length of an earlier period (provided by Vb). Where the length of the current period is shorter than 90% of the length of the earlier period, the first comparator output 22 signal C1 is generated in the second logic state (logic 0). This logic 0 state is indicative of the detection of a glitch (or other clock error) in the clock signal CLKIN.

The setting of the first threshold at 0.9 times (i.e., 90% of) the second period value Vb is matter of design choice. It will be understood that the first threshold could instead be set at another value. In any case, however, the first threshold is set at a value which is less than the second period value Vb.

The clock error detection circuit 10 further includes a latching circuit (LATCH) 24 having an input connected to the output 22 of the first comparator 20. The latching circuit 24 functions to capture and store the logic state of the first comparator output 22 signal C1 in response to an edge (for example, a positive edge) of the clock signal CLKIN. The latching circuit 24 further includes an output 26 whose logic state corresponds to the latched logic state of the signal C1. A glitch signal (GLITCH) may be produced from the output 26 of the latching circuit 24 to provide glitch detection information. So, if the latched output 26 and GLITCH signal is logic 0 then a glitch in the clock signal CLKIN has been detected.

The clock error detection circuit 10 further includes blocking circuit (BLOCK) 28 having an input connected to the output 26 of the latching circuit 24 and further having an input configured to receive the clock signal CLKIN. The blocking circuit 28 functions to selectively pass the clock signal CLKIN for output as a system clock CLK if the first comparator output 22 signal C1 is in the first logic state (logic 1). Conversely, when a glitch is detected and the first comparator output 22 signal C1 is in the second logic state (logic 0), the blocking circuit 28 functions to block, for one period P, passage of the clock signal CLKIN for output as the system clock CLK. In effect, this operation holds the logic state of the system clock CLK for the duration of that period where the glitch occurred, and thus prevents further propagation of the detected glitch to the system clock CLK.

The clock error detection circuit 10 further includes a second comparator circuit 30 having a first (for example, non-inverting +) input configured to receive the first period value Va and a second (for example, inverting −) input configured to receive the second period value Vb. The first comparator 30 is configured to have a second threshold (i.e., the comparator trip point) that is set as a function of the received second period value Vb. The second threshold is different from the first threshold. In a preferred embodiment, the second threshold is set at a value which is greater than the received second period value Vb. In an exemplary implementation, the second threshold is equal to 1.1×Vb. The second comparator 30 further has an output 32 configured to generate a second comparator output signal C2 having a logic state set in response to the comparison of the first period value Va to the second threshold. The second comparator output signal C2 has a first logic state (logic 0) if the first period value Va is smaller than the second threshold, and otherwise has a second logic state (logic 1).

The second comparator circuit 30 accordingly operates to compare the lengths of two selected periods of the clock signal CLKIN as represented by the first and second period values Va and Vb. The generated second comparator output 32 signal C2 has the first logic state (logic 1) if the length of the current period (provided by Va) is longer than 110% of the length of the earlier period (provided by Vb). This logic 1 state is indicative of the detection of a loss of clock (LOC) for the clock signal CLKIN. Where the length of the current period is shorter than 110% of the length of the earlier period, the second comparator output 32 signal C2 is generated in the second logic state (logic 0).

The setting of the first threshold at 1.1 times (i.e., 110% of) the second period value Vb is matter of design choice. It will be understood that the second threshold could instead be set at another value. In any case, however, the second threshold is set at a value which is more than the second period value Vb.

A loss of clock signal (LOC) signal may be produced from the output 32 of the second comparator 30 to provide loss of clock detection information.

As discussed above, the period values V may be determined and output in either an analog or digital signal format. Thus, it will be understood that the first and second comparators 20 and 30 may be implemented as either analog circuit devices or digital circuit devices.

Reference is now made to FIG. 2A which illustrates a circuit diagram for an exemplary implementation of the clock error detection circuit 10 of FIG. 1.

Figure 4:
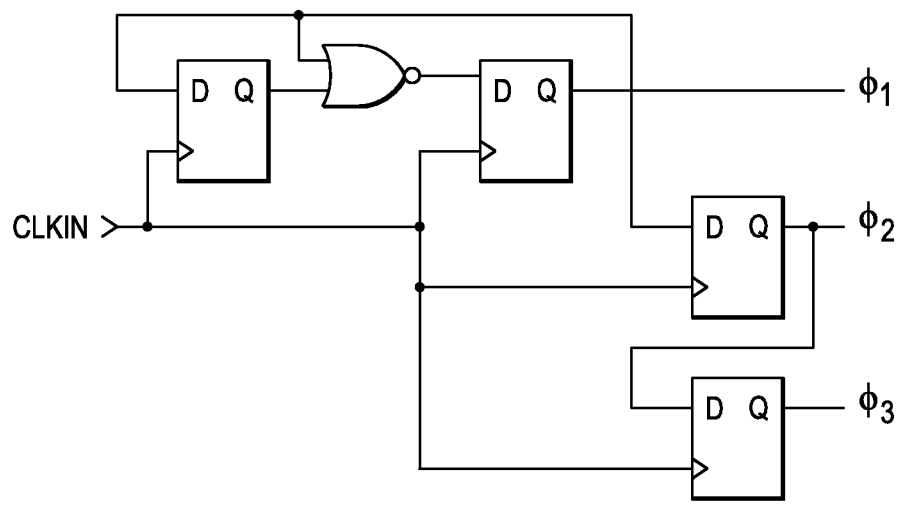
FIG. 4 is a circuit diagram of a counter configured to generate the waveforms of FIG. 3.

A multi-phase clock generator circuit 40 receives the clock signal CLKIN and generates a plurality of phase offset clocks ϕi (where i=1-n, n being an integer greater than or equal to 2, and more preferably greater than or equal to 3) synchronized to the clock signal CLKIN. Each of the clocks ϕ has a period that is n times the period of the clock signal CLKIN and duty cycle such that the on-time (pulse width) of the clock is equal to one period of the clock signal CLKIN. The phase offset clocks ϕi are preferably non-overlapping clocks. FIG. 3 illustrates the plurality of phase offset clocks ϕi in relation to the clock signal CLKIN for n=3. Those skilled in the art will appreciate that the multi-phase clock generator circuit 40 may accordingly be implemented as a mod-n counter circuit like that shown in FIG. 4.

To make a different signal parameter measurement, the on-time (pulse width) of the clock may instead be set equal to a different length, such as the length of a pulse width of the clock (in making a one-half period measurement) or the length of one and one-half periods.

The period conversion circuit 12 comprises a constant current source 42 configured to source a current into a switched capacitor circuit 44. The switched capacitor circuit 44 includes a plurality of capacitive charge-discharge circuits 46(i) (where i=1-n, n being an integer greater than or equal to 2, and more preferably greater than or equal to 3). Each capacitive charge-discharge circuit 46 includes a first switch 48 connected in series with a capacitor 50 at node 52 and a second switch 54 connected at node 52 in parallel with the capacitor 50. The first switch 48 which receives the current from the constant current source 42 is controlled by one of the phase offset clocks ϕ. When the first switch 48 is turned on by that controlling phase offset clock ϕ, the capacitor 50 accumulates charge from the constant current source 42 and the voltage at node 52 rises. When the first switch 48 turns off, the voltage at node 52 has a magnitude proportional to the length of the period P of the clock signal CLKIN which corresponds in time to the on-time of the controlling phase offset clock ϕ. The period value V is accordingly generated at node 52. The second switch 54 is controlled by another one of the phase offset clocks ϕ. When the second switch is later turned on by that another phase offset clock ϕ, the capacitor discharges and the voltage at node 52 falls.

The operational relationship of the switches 48 and 54 under the control of the two different phase offset clocks ϕ is: in a first time period, the switch 48 is closed and the switch 54 is opened resulting in the accumulation of charge in the capacitor 50 and providing the period value V; in a second time period, the switches 48 and 54 are both opened resulting in the saving of the accumulated charge in the capacitor 50 and providing the period value V; and in a third time period, the switch 54 is closed and the switch 48 is opening resulting in a discharge of the accumulated charge from the capacitor 50. The first, second and third time periods may, in one embodiment, be consecutive time periods.

The selection circuit 16 comprises a pair 60 of switches for each period value V output 14 from the period conversion circuit 12. Each pair 60 includes a first switch 62 and a second switch 64 that are controlled by ones of the phase offset clocks ϕ. The operation of the first switch 62 in each pair corresponds to the operation of the capacitive charge-discharge circuit 46 to which the pair 60 is coupled when the first and second switches 48 and 54 of that circuit 46 are both turned off. The operation of the second switch 64 in each pair 60 corresponds to the operation of the first switch 48 in the capacitive charge-discharge circuit 46 to which the pair 60 is coupled through output 14. In other words, the first switch 48 and second switch 64 are controlled by the same phase offset clock ϕ.

The first switch 62 in each pair 60 functions to pass the received period value V (as the value Vb) to the inverting inputs of the first and second comparators 20 and 30. The second switch 64 in each pair 60 functions to pass the received period value V (as the value Va) to the non-inverting inputs of the first and second comparators 20 and 30.

It will be understood that in an alternative embodiment, the value Vb may instead comprise a fixed reference value (or threshold) that is not selected from the values V.

The latching circuit 24 may be implemented using a flip-flop circuit 70. In an embodiment, the flip-flop circuit 70 may comprise a D-type flip-flop with the D input coupled to receive the first comparator output 22 signal C1. The clock input of the D-type flip-flop is coupled to receive the clock signal CLKIN, and the flip-flop functions to latch the logic state present at the D input at the rising edge of clock signal CLKIN. The Q output of the D-type flip-flop circuit produces the glitch signal (GLITCH).

The blocking circuit 28 may be implemented as a logic circuit including a delay element 80 and an AND logic gate 82. The delay element 80 includes an input configured to receive the clock signal CLKIN. The delay element functions to delay propagation of the clock signal CLKIN for a time period at least equal to the time needed to perform the comparison operation (by comparator 20) and the latching operation (performed by the flip-flop circuit 70). The AND gate 82 functions as a controllable pass element, with control exercised by the logic state of the output 26 from the latching circuit 24. When the output 26 is logic high, which is indicative of a no-glitch condition of the clock signal CLKIN, the AND gate 82 passes the logic state of the delayed clock signal CLKIN for output as the system clock CLK. However, when the output 26 is logic low, which is indicative of a detected glitch in the clock signal CLKIN, the AND gate 82 holds the current logic state of the system clock CLK for the length of the period of the clock signal CLKIN in which the glitch was detected.

Reference is now made to FIG. 2B which illustrates a circuit diagram for an exemplary implementation of the clock error detection circuit 10 of FIG. 1 which implements the averaging circuit 17. Like reference numbers between FIGS. 2A and 2B refer to like or similar parts and will not be further described.

In FIG. 2B, the switches 62 selectively pass the received period value V to the averaging circuit 17. Over time, the averaging circuit collects the received period values V and generates an average period value Vave (from two or more of the received period values) for output (as the value Vb) to the inverting inputs of the first and second comparators 20 and 30.

Figure 5:
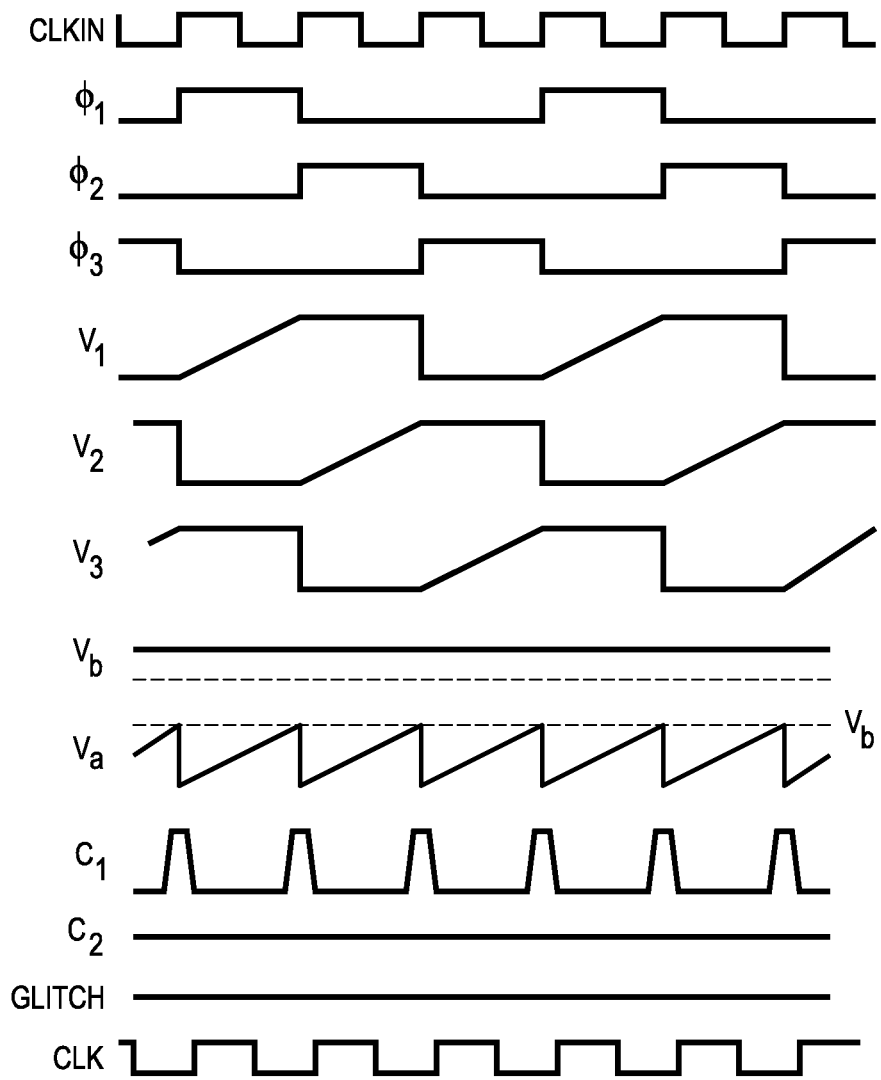
FIG. 5 illustrates operational waveforms for the circuit of FIG. 2A in the absence of clock anomalies.

Reference is now made to FIG. 5 which presents a waveform diagram illustrating operation of the circuit of FIG. 2A where the clock signal CLKIN is clean. The illustrated waveforms are for a system where n=3. It will be noted that the first comparator output 22 signal C1 rises to logic high where the period value Va for the current period exceeds the first threshold (set as a function of the period value Vb for the immediately preceding period). Because the clock signal CLKIN is clean, the signal C1 rises to the first logic level at the beginning of each clock period. As a result, the output 26 from the latching circuit 24 is latched logic high and the blocking circuit 28 passes the logic states of clock signal CLKIN as the system clock CLK.

It will further be noted that the second comparator output 32 signal C2 does not change state because at no point in time does the period value Va in the current period exceed the second threshold (set as a function of the period value Vb in the immediately preceding period). Because the clock signal CLKIN is clean, there is no indication of a loss of clock (LOC).

Figure 6A:
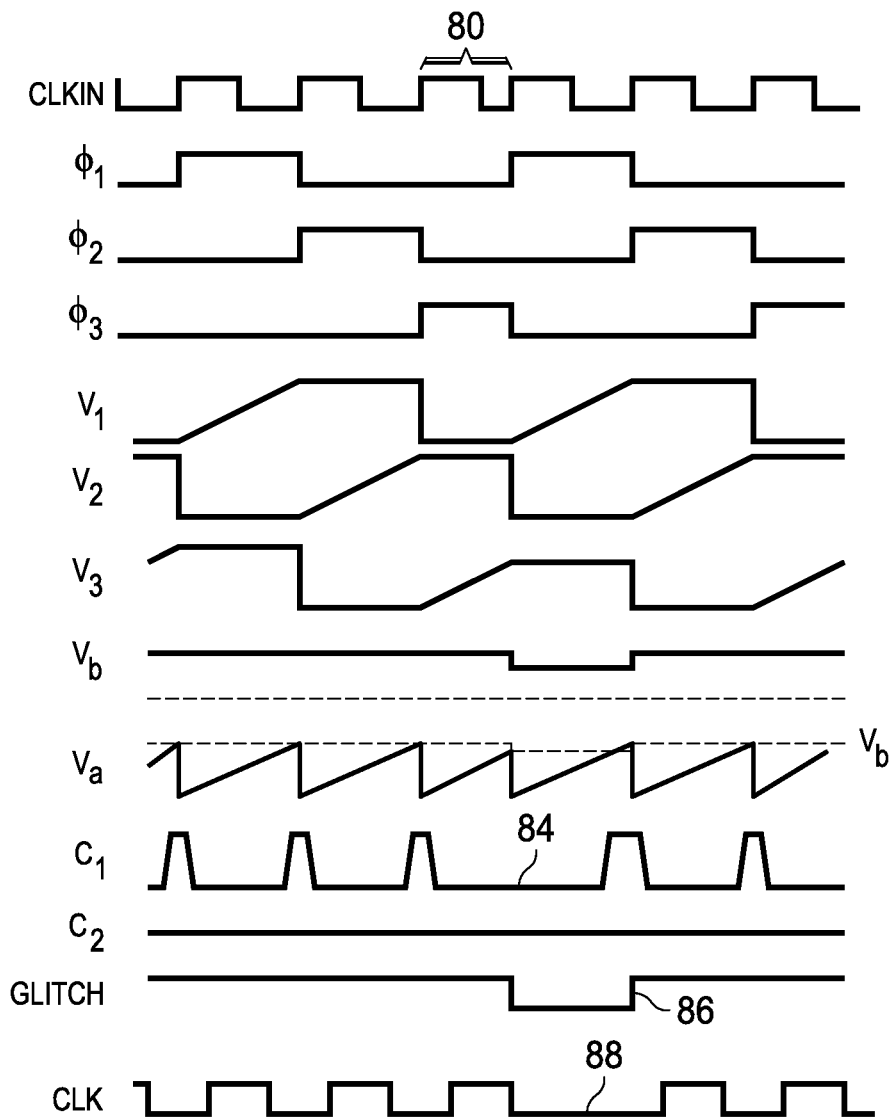
FIGS. 6A and 6B illustrate operational waveforms for the circuit of FIG. 2A in the presence of clock anomalies.
Figure 6B:
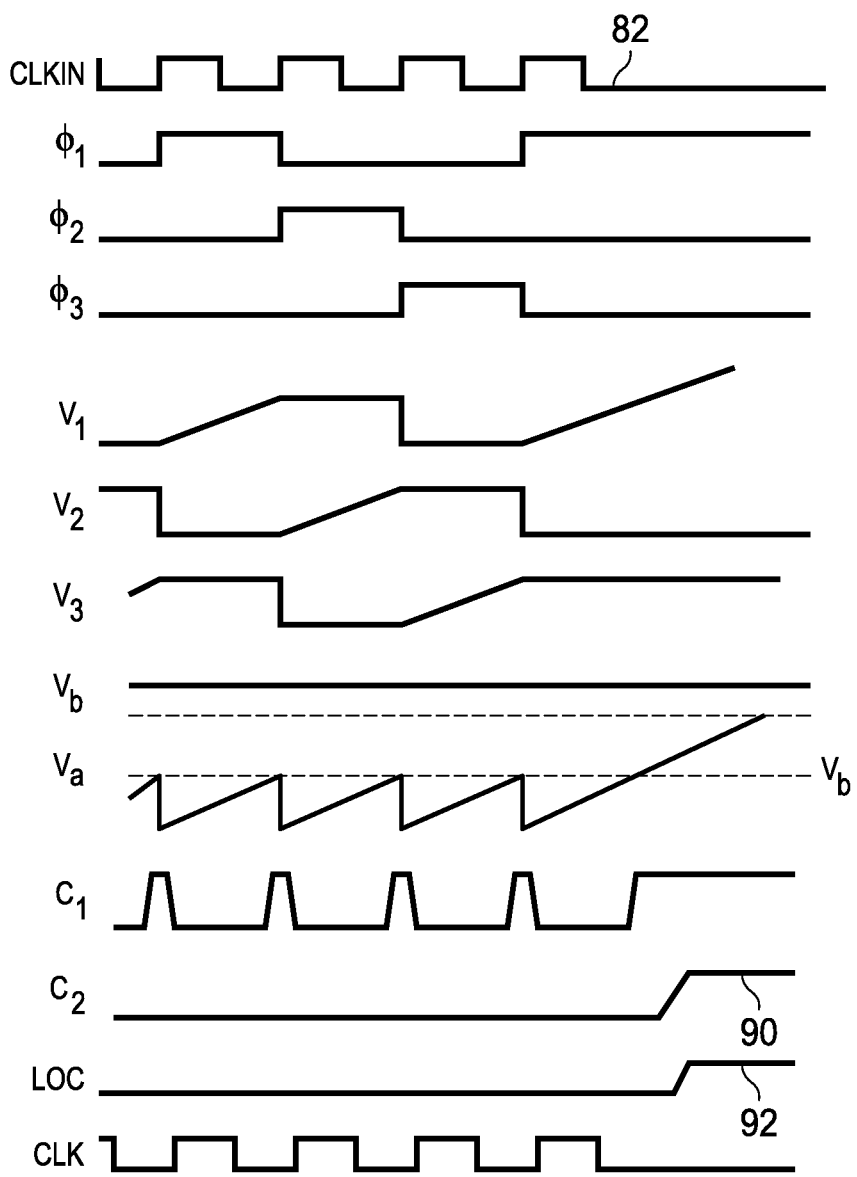

Reference is now made to FIGS. 6A and 6B which present waveform diagrams illustrating operation of the circuit of FIG. 2A where the clock signal CLKIN contains anomalies. The illustrated waveforms are for a system where n=3. Two different anomalies are presented with respect to the clock signal CLKIN. The first anomaly occurs at reference 80 in FIG. 6A and concerns a short cycle (short period or glitch) of the clock signal CLKIN. The second anomaly occurs at reference 82 in FIG. 6B and concerns a clock loss of the clock signal CLKIN. Both of these anomalies are detected.

With reference to FIG. 6A, it will be noted that the first comparator output 22 signal C1 rises to logic high where the period value Va in the current period exceeds the first threshold (set as a function of the period value Vb for the immediately preceding period). However, the signal C1 is not high at each instance of a leading edge of the clock signal CLKIN, and so there are instances (reference 84) where no latching of the logic high value occurs. This is indicative of the detection of a glitch (reference 86) in the clock signal CLKIN. As a result, the blocking circuit 28 will block the short period 80 from passing as the system clock CLK (reference 88).

With reference to FIG. 6B, it will be further noted that the second comparator output 32 signal C2 rises to logic high (reference 90) where the period value Va exceeds the second threshold (set as a function of the period value Vb). This occurs at instances where the period is too long such as with clock loss 82. Because of this anomaly, the loss of clock (LOC) signal is asserted (reference 92).

The foregoing operations can be extended to detect other clock errors.

For example, with respect to detecting short pulse width or duty cycle errors, the conversion circuit 12 can be configured to measure one or more of the following signal parameters: a) half-cycle width (i.e., the logic 1 or 0 length within a single period; and b) one and one-half cycle width (i.e., the length of 1.5 periods). The resulting signal parameters can then be processed, in a manner similar to the processing of the period value parameters discussed above, to make clock error detections. One such processing operation could comprise comparing 0.5 period length and/or the 1.5 period length to a fixed set of thresholds (high and low) in a window comparator to detect instances of the duty cycle straying from a specified duty cycle of the clock. This operation could be achieved by altering the circuit of FIG. 4 so that the phase offset clocks φ have a pulse width equal to the length of the signal parameter being measured. For example, by setting the pulse width of the phase offset clocks φ to be equal to one-half cycle the measurement of reference a) above can be made.

It is also possible to configure the conversion circuit to measure the length between consecutive rising and/or the length between consecutive falling edges. The resulting signal parameters can then be processed, in a manner similar to the processing of the period value parameters discussed above, to make clock error detections. One such processing operation could comprise determining whether the measured parameters differ from each other by more than a threshold or individually different from a set threshold.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
    a conversion circuit configured to measure signal parameters with respect to each period within a plurality of individual periods of a clock signal;
    a selection circuit configured to output a first parameter value selected from the measured signal parameters;
    a first comparator circuit configured to compare the first parameter value to a first threshold; and
    an output circuit configured to output a first clock error signal in response to said first comparator circuit.

2. The circuit of claim 1, wherein the selection circuit is further configured to output a second parameter value selected from the measured signal parameters, and wherein the first threshold is set as a function of the second parameter value.

3. The circuit of claim 2, wherein the first threshold is set as a function of an average of a plurality of second parameter values.

4. The circuit of claim 1, further comprising a second comparator circuit configured to compare the first parameter value to a second threshold and output a second clock error signal, wherein the second threshold is different than the first threshold.

5. The circuit of claim 4, wherein the selection circuit is further configured to output a second parameter value selected from the measured signal parameters, and wherein the second threshold is set as a function of the second parameter value.

6. The circuit of claim 1, wherein the signal parameter is period length of individual periods of the clock signal.

7. The circuit of claim 1, wherein the signal parameter is pulse length of individual periods of the clock signal.

8. A circuit, comprising:
    a conversion circuit configured to measure a period length of each of period within a plurality of individual periods of a clock signal;
    a selection circuit configured to output a first period length and a second period length selected from the measured period lengths;
    a first comparator circuit configured to compare the first period length to a first threshold set as a function of the second period length; and
    an output circuit configured to output a first clock error signal in response to said first comparator circuit.

9. The circuit of claim 8, wherein the output circuit comprises:
a latch circuit configured to latch an output of the first comparator circuit in response to an edge of said clock signal and generate said first clock error signal; and
a blocking circuit configured to selectively pass said clock signal for output in response to said first clock error signal output from said latch circuit.

10. The circuit of claim 8, wherein the first period length corresponds to a current period of said clock signal and the second period length corresponds to a period of said clock signal preceding the current period.

11. The circuit of claim 8, further comprising a second comparator circuit configured to compare the first period length to a second threshold set as a function of the second period length and output a second clock error signal, wherein the second threshold is different than the first threshold.

12. The circuit of claim 11, wherein the second threshold is greater than the first threshold.

13. The circuit of claim 11, wherein the second threshold is greater than the second period length and the first threshold is less than the second period length.

14. The circuit of claim 8, wherein the first threshold is less than the second period length.

15. The circuit of claim 8, wherein the conversion circuit comprises:
a current source; and
a plurality of switched capacitor circuits, each switched capacitor circuit comprising:
a first switch;
a capacitor coupled in series with the first switch; and
a second switch coupled in parallel with the capacitor.

16. The circuit of claim 15, further comprising control circuitry configured to control operation of the first and second switches in response to said clock signal to:
close the first switch and open the second switch during one period of the clock signal;
open both the first and second switches during another period of the clock signal; and
close the second switch and open the first switch during yet another period of the clock signal.

17. The circuit of claim 15, wherein the selection circuit comprises a plurality of switch pairs corresponding to the plurality of switched capacitor circuits, each pair comprising:
a third switch configured to couple the switched capacitor circuit to a first input of the first comparator circuit; and
a fourth switch configured to couple the switched capacitor circuit to a second input of the first comparator circuit.

18. The circuit of claim 17, further comprising control circuitry configured to control operation of the third and fourth switches in response to said clock signal to:
close the third switch during one period of the clock signal; and
close the fourth switch during another period of the clock signal.

19. The circuit of claim 18, wherein the control circuitry is further configured to control operation of the first and second switches in response to said clock signal to:
close the first switch and open the second switch during said one period of the clock signal; and
open both the first and second switches during said another period of the clock signal.

20. The circuit of claim 8, further comprising an averaging circuit configured to average a plurality of second period lengths, said first threshold set as a function of the average of the second period lengths.

21. A method, comprising:
measuring a signal parameter with respect to each period within a plurality of individual periods of a clock signal;
selecting a first parameter value from the measured signal parameters;
first comparing the first parameter value to a first threshold; and
outputting a first clock error signal in response to said first comparison.

22. The method of claim 21, further comprising selecting a second parameter value from the measured signal parameters, and wherein the first threshold is set as a function of the second parameter value.

23. The method of claim 22, further comprising averaging a plurality of second parameter values and setting the first threshold as a function of the average of the plurality of second parameter values.

24. The method of claim 21, further comprising second comparing the first parameter value to a second threshold and outputting a second clock error signal, wherein the second threshold is different than the first threshold.

25. The method of claim 24, further comprising selecting a second parameter value from the measured signal parameters, and wherein the second threshold is set as a function of the second parameter value.

26. The method of claim 21, wherein the signal parameter is period length of individual periods of the clock signal.

27. The method of claim 21, wherein the signal parameter is pulse length of individual periods of the clock signal.

28. A method, comprising:
measuring a period length of each period within a plurality of individual periods of a clock signal;
selecting a first period length and a second period length from the measured period lengths;
comparing the first period length to a first threshold set as a function of the second period length; and
outputting a result of said comparison as a first clock error signal.

29. The method of claim 28, further comprising latching a result of said comparison to provide said first clock error signal.

30. The method of claim 28, further comprising selectively passing said clock signal for output in response to said first clock error signal.

31. The method of claim 28, wherein the first period length corresponds to a current period of said clock signal and the second period length corresponds to a period of said clock signal preceding the current period.

32. The method of claim 28, further comprising additionally comparing the first period length to a second threshold set as a function of the second period length and outputting a second clock error signal, wherein the second threshold is different than the first threshold.

33. The method of claim 32, wherein the second threshold is greater than the first threshold.

34. The method of claim 33, wherein the second threshold is greater than the second period length and the first threshold is less than the second period length.

35. The method of claim 28, wherein the first threshold is less than the second period length.

36. The method of claim 28, further comprising averaging a plurality of second period lengths and setting the first threshold set as a function of the average of the second period lengths.

* * * * *